(12) United States Patent
Klatt et al.

(10) Patent No.: US 6,440,831 B1
(45) Date of Patent: Aug. 27, 2002

(54) IONIZED METAL PLASMA DEPOSITION PROCESS HAVING ENHANCED VIA SIDEWALL COVERAGE

(75) Inventors: Jeffrey Klatt, San Antonio, TX (US); Somchintana Norasetthekul, Danvers, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/731,526

(22) Filed: Dec. 6, 2000

(51) Int. Cl.⁷ .............................................. H01L 21/44
(52) U.S. Cl. ...................... 438/597; 438/656; 438/685; 438/785; 204/192.17
(58) Field of Search ................................ 438/628, 644, 438/648, 656, 685, 597, 785

(56) References Cited

U.S. PATENT DOCUMENTS

| | | | |
|---|---|---|---|
| 4,714,798 A | * 12/1987 | Novak et al. ................ 136/239 |
| 4,783,248 A | 11/1988 | Kohlhase et al. ........ 204/192.17 |
| 5,108,569 A | * 4/1992 | Gilboa et al. ............ 204/192.13 |
| 5,114,556 A | * 5/1992 | Lamont, Jr. ............. 204/192.12 |
| 5,646,449 A | 7/1997 | Nakamura et al. ........... 257/763 |
| 5,858,471 A | 1/1999 | Ray et al. .................... 427/526 |
| 5,882,399 A | * 3/1999 | Ngan et al. .................... 117/89 |
| 5,976,327 A | * 11/1999 | Tanaka .................. 204/192.15 |
| 6,042,700 A | * 3/2000 | Gopalraja et al. ....... 204/192.15 |
| 6,051,121 A | * 4/2000 | Givens et al. .......... 204/298.06 |
| 6,077,779 A | * 6/2000 | Shue et al. ................. 438/680 |
| 6,080,285 A | * 6/2000 | Liu et al. ................ 204/192.12 |
| 6,176,983 B1 | * 1/2001 | Bothra et al. .......... 204/192.17 |
| 6,207,567 B1 | * 3/2001 | Wang et al. ................. 438/685 |
| 6,218,288 B1 | * 4/2001 | Li et al. ..................... 438/627 |

* cited by examiner

*Primary Examiner*—John F. Niebling
*Assistant Examiner*—Angel Roman
(74) *Attorney, Agent, or Firm*—Peter Zawilski

(57) ABSTRACT

A method for depositing an adhesion layer in a contact region on a semiconductor substrate provides for sufficient coverage on the bottom and sidewalls of the contact region. In an example embodiment, a contact region having a bottom and sidewalls has a first coat of the adhesion layer deposited thereon at a thickness greater than the thickness on the sidewall. To compensate for the narrower adhesion layer thickness on the sidewalls, a second coat of the adhesion layer is deposited so that the second coat on the sidewalls is at a thickness greater than the second coat thickness on the bottom. The adhesion layer is titanium nitride although other materials may be used as well.

7 Claims, 3 Drawing Sheets

IONIZED METAL PLASMA DEPOSITION PROCESS HAVING ENHANCED VIA SIDEWALL COVERAGE

FIELD OF INVENTION

The present invention is generally directed to the manufacture of a semiconductor device. In particular, the present invention relates to a process that provides for enhancement of contact sidewall coverage of refractory metal nitrides.

BACKGROUND OF INVENTION

Thin film aluminum and aluminum alloys are fundamental materials having application in semiconductor processing. Aluminum is a good conductor, adheres well to silicon and silicon dioxide. A significant problem in using aluminum for interconnects stems from problems of junction spiking that may occur at the interface of pure aluminum and silicon when the interface is heated as is with normal semiconductor processing heat treatments (e.g., annealing). This spiking occurs between the aluminum/silicon interface of a the p-n junction below a contact owing to the solubility of silicon in aluminum (e.g., to about 0.5% at 400° C.) which increases with temperature. If the penetration by the aluminum is beyond the p-n junction depth below the contact, the junction will be electrically shorted.

One technique to address this challenge is to use an aluminum alloy having a concentration of silicon in excess of the silicon solubility at the maximum process temperature the substrate may encounter. Thus, when the (Al—Si)-silicon interface is heated, the aluminum alloy film does not draw silicon into solution from the substrate, and junction spiking is avoided.

As device dimensions are approaching fractional microns, the use of Al—Si films appears to be inadequate. The shallower junctions, narrower metal lines, and more severe topography of VLSI circuits are less tolerant of Si precipitation in the Al—Si film that occurs when such films are cooled down from 400° C. temperature steps. In addition, electromigration failure at Al—Si contacts becomes- more severe as the contacts get smaller. In an effort to address the shortcomings of Al—Si contacts, more elaborate contact structures employing barrier materials and other layers have been used as replacements (e.g., Si/W/Al, or Si/PtSi/TiW/Al contact structures.

Refractory metal nitrides, particularly titanium nitride TiN) are employed as a barrier material to prevent spiking of aluminum into a silicon substrate. The barrier material is often applied by chemical vapor deposition (CVD) or sputtering. In one example process, titanium nitride (TiN) is used as a barrier material in conjunction with tungsten prior to the deposition of aluminum. TiN is a thin-film of choice for CVD tungsten (W) adhesion layer. TiN is also used as a fluorine-resistant glue layer during subsequent tungsten CVD where $WF_6$ is a reactant. Since tungsten does not stick to oxide surface underneath, peeling may occur wherever there is not a TiN film present. In addition, the reaction of $WF_6$ to any exposed oxide layer causes a chemical reaction that manifests itself in the production of "volcano-like" damage at the top corners of the contacts. Consequently, having good TiN layer coverage inside the contact is important for device reliability and yield.

Sputtering is a widely used deposition technique for a variety of metallic films, including aluminum, aluminum alloys, platinum, gold, titanium-tungsten, tungsten. Sputtering describes the mechanism in which atoms are dislodged from the surface of a material by collision with high-energy particles. Ionized metal plasma (IMP) sputtering provides good contact bottom coverage of TiN layer for small feature sized devices of less than 0.25 μm. However, the sidewall coverage is not sufficient and may result in the aforementioned shortcomings. In U.S. Pat. No. 4,783,248 titled "Method for the Production of a Titanium/Titanium Nitride Double Layer," issued to Armin Kohlhase et al., discusses some of the challenges involved in producing a titanium-based film and is incorporated herein by reference in its entirety.

Refer to FIG. 1. In a conventional process on a silicon substrate 100, a poly silicon or a diffusion layer 110 has been subjected to a silicidation 120 with a refractory metal, usually titanium. An inter-metal oxide (IMO) layer 130 provides electrical isolation for the contact region 150 defined in the IMO layer 130. A layer 140 of TiN is sputtered on the contact region 150 and exhibits thinning at 140*a*. If too thin, there may be a lack of coverage at 140*a*.

There exists a need to provide overall sufficient coverage in the contacts so that device reliability is maintained at a reasonable cost.

SUMMARY OF INVENTION

The present invention is exemplified in a number of implementations, one of which is summarized below. During the forming of electrical contacts in a device structure, it is a challenge to ensure that metal will sufficiently adhere to the dielectric materials surrounding the contacts. Tungsten does not stick to an oxide surface. Consequently, an adhesion layer is provided to improve the bond and to protect the underlying oxide layer from reacting with byproducts of the tungsten deposition process. Usually, such an adhesion layer is titanium nitride. In forming the adhesion layer, coverage on the bottom and sidewalls of the contact has to be assured to minimize contact failure. In an example embodiment according to the present invention, on a semiconductor substrate, there is a method for depositing an adhesion layer in a contact region having a bottom and sidewalls. The method comprises depositing a first coat of the adhesion layer in the contact regions so that the bottom receives the first coat of adhesion layer at thickness greater than the thickness on at least part of the sidewalls. Next, a second coat of the adhesion layer in the contact region is deposited so that the sidewalls receive the second coat of adhesion layer at a thickness greater than the thickness greater than the thickness on the bottom.

The above summary of the present invention is not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1:
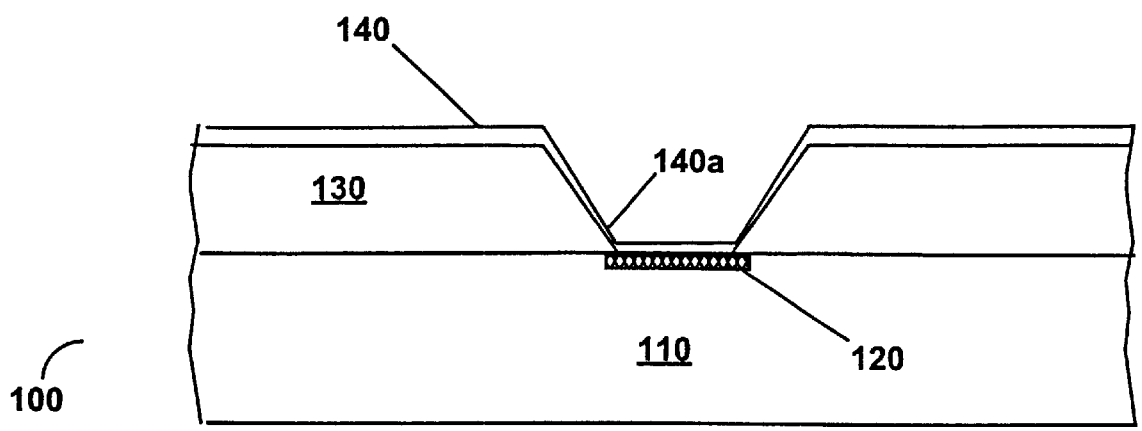
FIG. 1 is a cross-sectional view of a prior art process for applying a titanium nitride film in a contact region of a semiconductor substrate.

While the invention is susceptible to various modifications and alternative forms, specific embodiments thereof have been shown by way of example in the drawings and will herein be described in detail.

DETAILED DESCRIPTION

The present invention has been found to be useful and advantageous in connection with providing a TiN thin film that provides sufficient coverage in the contact region having a high aspect ratio in devices having dimensions on the order of less than a quarter micron. These contact regions are often referred to as "contacts" if the first conductive layer is applied thereon to provide the electrical connection. Subsequent conductive layers are isolated by IMO Culter metal oxide), contact regions defined in these layers are often referred to as "vias." In the discussion that follows, a MOS structure with TiN is used to describe an example implementation of the invention. However, the invention is not so limited.

An IMP sputtering apparatus is used to provide sufficient bottom coverage. IMP TiN deposition uses RF coils to ionize the sputtered metal. The ionized metal ions are then attracted to the wafer surface at a near perpendicular angle by the DC self bias, resulting in a higher probability of deposition at the bottom of contact regions. To further increase bottom coverage, negative AC bias supplied to the wafer controls the ions so that they strike the wafer surface in a normal direction. However, this may reduce the sidewall coverage. To address the sidewall coverage, a second subsequent TiN deposition is done with the RF coil and AC bias power adjusted so that the sputtered TiN more readily covers the contact region sidewalls. Such a two-stage deposition may be done within the same sputter chamber or in two separate chambers provided the user does not expose the wafer substrate to air.

The aforementioned process may be more easily understood by referring to a series of cross-sections as depicted in FIGS. 2A–2D.

Figure 2A:
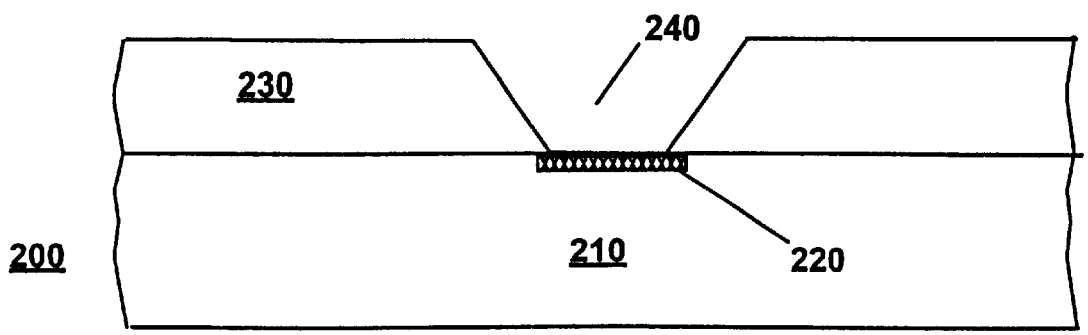
FIG. 2A is a cross-section view of a contact region after silicidation of the silicon region prior to application of titanium nitride in a process according to an embodiment of the present invention.

Refer to FIG. 2A a substrate 200 has a poly silicon or diffusion region 210 that has undergone silicidation 220. A dielectric layer 230, usually silicon oxide has a contact region 240 defined over the silicidation 220. Silicidation of poly-silicon or silicon in diffusion regions is well known.

Figure 2B:
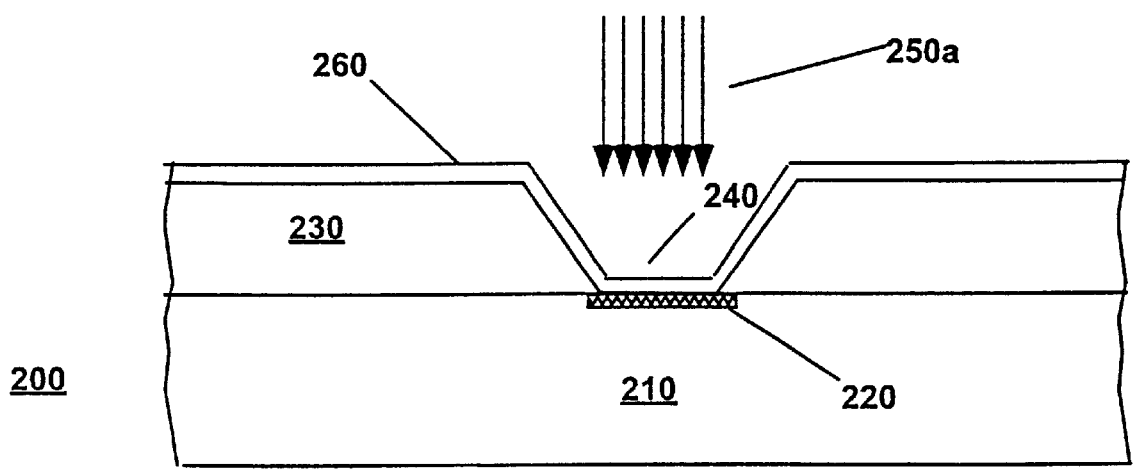
FIG. 2B depicts FIG. 2A after applying titanium nitride in a process according to an embodiment of the present invention.

Refer to FIG. 2B. After the silicidation, a titanium nitride layer 260 is sputtered on the base and sidewalls of the contact region 240. In an example process, the TiN is applied in two steps. First, the TiN is IMP sputtered on the substrate 200 with both RF coil and AC bias power supply on to enhance to bottom coverage as depicted by the arrows 250a. This TiN is applied onto the substrate such that the ratio of nitrogen to titanium is 1:1, the "golden stoichiometry" region. This region (the TiN having a golden color) is characterized by a high resistance to diffusion through the titanium nitride layer and makes for good barrier properties and a minimal sheet resistance. In the first stage of the example process, the AC bias power is about 5.0 kW and the RF power is about 2.5 kW, pressure is about 24.15 mTorr. The carrier gas composition is Ar/N$_2$ in a ratio of about 15/90. A layer of about 90 Å to 100 Å is deposited with enhanced bottom coverage.

Figure 2C:
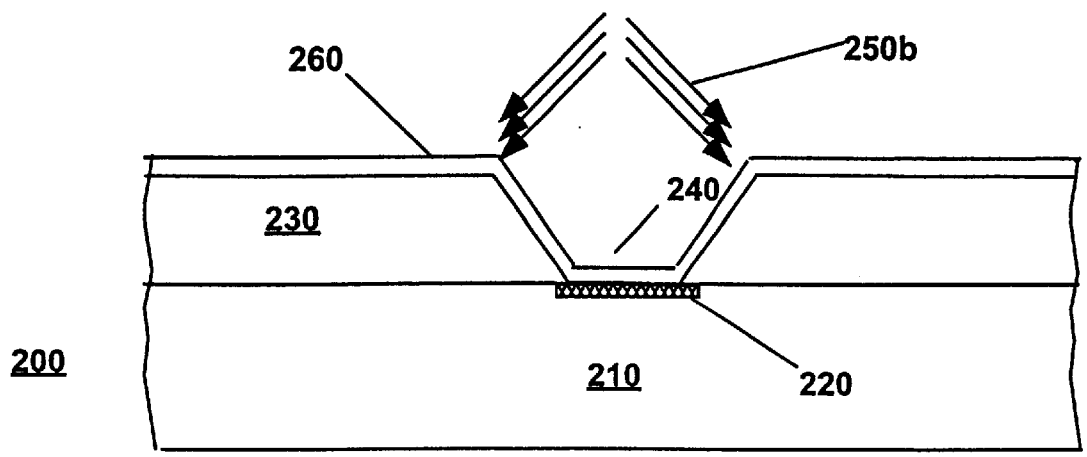
FIG. 2C depicts FIG. 2B after tungsten deposition emphasizing bottom coverage.

Refer to FIG. 2C. Second, the TiN 260 is sputtered with lower power to the RF coil but with AC bias to enhance the sidewall coverage as depicted by the arrows 250b. In the second stage of the example process, the AC bias power is about 6.0 kW and the RF power is about 1.0 kW, pressure is about 24.05 mTorr. The carrier gas composition is Ar/N$_2$ in a ratio of about 15/90. However, the recipe for the desired TiN that may be is not restricted to one particular set of parameters.

Figure 2D:
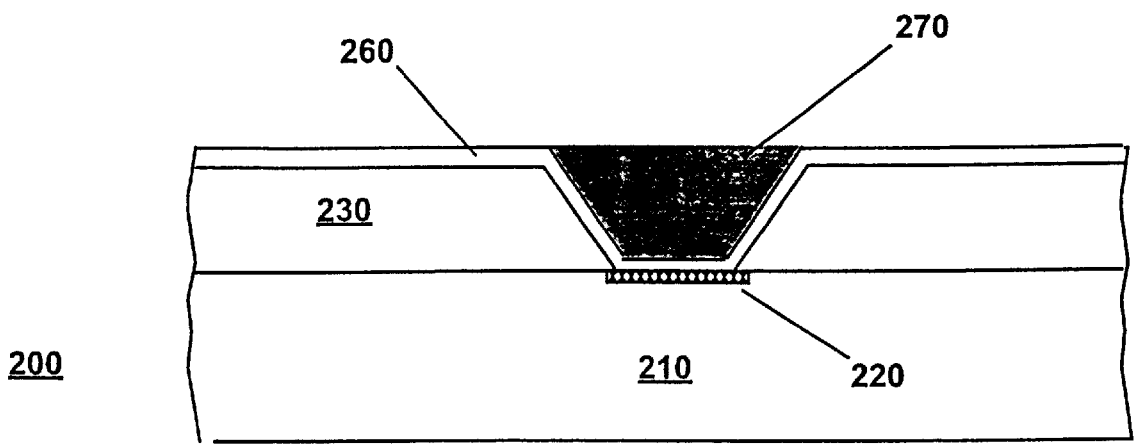
FIG. 2D depicts FIG. 2C after tungsten deposition emphasizing sidewall coverage.

Refer to FIG. 2D. Having provided a DIN film that provides sufficient contact region coverage, metal 270 such as an aluminum alloy may be deposited therein. The TiN barrier having sufficient thickness throughout the contact prevents any spiking of the aluminum into the junction of the transistor.

While the present invention has been described with reference to several particular example embodiments, those skilled in the art will recognize that many changes may be made thereto without departing from the spirit and scope of the present invention, which is set forth in the following claims.

What is claimed:

1. A method for sputtering an adhesion layer in a contact region on a semiconductor substrate, the contact region having a bottom and sidewalls, the method comprising:

sputtering a first coat of the adhesion layer in the contact region so that the adhesion layer material travels in a direction toward to the bottom of the contact region, wherein the sputtering of the first coat of the adhesion layer is done with IMP sputtering, having directional control to send adhesion layer toward the bottom of the contact region; and sputtering a second coat of the adhesion layer in the contact region so that the adhesion layer material travels in a direction toward the sidewalls, wherein the sputtering of the second coat of the adhesion layer is without directional control; and wherein the adhesion layer includes materials selected from the group of: Ti, Ti:W, TiN, WSi$_x$, Ti/TiN.

2. The method of claim 1 wherein the directional control comprises the use of RF and AC bias.

3. The method of claim 2 wherein the adhesion layer is deposited at a thickness in the range of about 50 Å to about 200 Å.

4. A method of sputtering a titanium nitride adhesion layer, in an Ar/N$_2$ environment maintained to yield stoichiometric titanium nitride (TiN), in a contact region on a semiconductor substrate, the contact region having a bottom and sidewalls, the method comprising:

sputtering from a target a first coat of the TiN adhesion layer in the contact region so that the adhesion layer material travels in a direction toward to the bottom of the contact region; and C sputtering from the target a second coat of the TiN adhesion layer in the contact region so that the TiN adhesion layer material travels in a direction toward the sidewalls;

wherein, sputtering of the first coat of TiN further comprises, applying a first predetermined AC bias power on the semiconductor substrate and exposing the substrate to a first predetermined RF field power; and wherein sputtering of the second coat of the TiN layer filer comprises, applying a second predetermined AC bias power on the semiconductor substrate and exposing the substrate to a second predetermined RF field power.

5. The method of claim 4, wherein the first predetermined AC bias power is in the range of about 4.5 kW to 5.5 kW and the first predetermined RF field power is in the range of about 1.0 kW to 3.0 kW; and wherein second predetermined AC bias power is in the range of about 5.5 kW to 7.5 kW and the second predetermined RF field power is in the range of about 0 kW to 1.5 kW.

6. The method of claim 5, wherein the pressure in $Ar/N_2$ environment is in the range of about 23 mTorr to about 25 mTorr.

7. The method of claim 6, wherein the $Ar/N_2$ environment is maintained at an $Ar:N^2$ ratio of about 15:90.

\* \* \* \* \*